United States Patent
Menkhoff

(10) Patent No.: US 9,871,682 B2
(45) Date of Patent: Jan. 16, 2018

(54) METHOD, APPARATUS AND COMPUTER PROGRAM FOR DETERMINING AN INTERPOLATED COMPLEX VALUED SAMPLE

(71) Applicant: Intel IP Corporation, Santa Clara, CA (US)

(72) Inventor: Andreas Menkhoff, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 129 days.

(21) Appl. No.: 14/708,431

(22) Filed: May 11, 2015

(65) Prior Publication Data

US 2015/0363362 A1 Dec. 17, 2015

(30) Foreign Application Priority Data

Jun. 13, 2014 (DE) .................. 10 2014 108 345

(51) Int. Cl.
*H04L 27/10* (2006.01)
*H04L 7/00* (2006.01)

(52) U.S. Cl.
CPC ............ *H04L 27/10* (2013.01); *H04L 7/0029* (2013.01)

(58) Field of Classification Search
None
See application file for complete search history.

(56) References Cited

U.S. PATENT DOCUMENTS 8,872,596 B2 * 10/2014 Collados Asensio .... H03C 3/40
332/145
2007/0189417 A1   8/2007 Waheed et al.
2008/0101500 A1   5/2008 Voloshin et al.
2009/0262944 A1 * 10/2009 Golitschek ........ H04L 25/03866
380/287

FOREIGN PATENT DOCUMENTS

WO         0223840 A1    3/2002

* cited by examiner

*Primary Examiner* — Michael D Yaary
(74) *Attorney, Agent, or Firm* — Eschweiler & Potashnik, LLC

(57) ABSTRACT

In a method for determining an interpolated complex valued sample, a radial component of the interpolated sample is determined using information on a radial component and information on of a phase component of a first complex valued sample and of a second complex valued sample.

14 Claims, 5 Drawing Sheets

METHOD, APPARATUS AND COMPUTER PROGRAM FOR DETERMINING AN INTERPOLATED COMPLEX VALUED SAMPLE

CROSS REFERENCE TO RELATED APPLICATIONS

This application claims priority to German Application number 10 2014 108345.8 filed on Jun. 13, 2014.

FIELD

Embodiments relate to methods for determining an interpolated complex-valued sample and to interpolators.

BACKGROUND

Examples, where interpolation of complex numbers or symbols is performed are numerous. For example, in wireless mobile telecommunication systems, the data samples or data symbols may be provided at a relative low rate (e.g. 30.72 MHz for LTE20) within the baseband, while the frequency of the carrier is significantly higher (for example 1 . . . 2 GHz). When the data represented by complex numbers or complex-valued symbols is to be processed so as to be transmitted by means of the carrier with a high frequency, interpolation between the complex-valued samples or symbols of the baseband signal may be used to generate a trajectory connecting the interpolated complex-valued samples in the constellation diagram. The trajectory may be modulated on the carrier frequency so as to wirelessly transmit the complex-valued samples at the carrier frequency.

In mobile telecommunication applications, an in-phase (I) and a quadrature (Q) component of the complex-valued samples are often processed individually before being modulated on the carrier. To this end, also interpolation between subsequent I- and Q-components of the complex values may be performed separately, e.g. the I-components of the interpolated complex-valued samples may be determined using only the I-components of the neighboring samples.

Other implementations use a R,φ-representation of the complex-valued samples in order to directly generate the transmit signal at the carrier frequency digitally. That is, a complex-valued sample is represented by a radius value R giving its distance from the origin within the constellation diagram and by an angle φ with respect to a predetermined axis of the complex plane. For an R/φ-representation, the concept to interpolate radius components of complex values using only R-components of the neighboring complex samples (φ likewise) may introduce systematic errors and. Even if the interpolation accuracy and the number of interpolated samples between two neighboring complex-valued samples is increased, the spectrum of the resultant interpolated signal may exhibit a significant error contribution which may violate a spectral requirement for the transmit spectrum of the so-generated signal. There may be a desire to improve the determination of interpolated complex-valued samples.

BRIEF DESCRIPTION OF THE FIGURES

Some examples of apparatuses and/or methods will be described in the following by way of example only, and with reference to the accompanying figures, in which.

DETAILED DESCRIPTION

Various example examples will now be described more fully with reference to the accompanying drawings in which some example examples are illustrated. In the figures, the thicknesses of lines, layers and/or regions may be exaggerated for clarity.

Accordingly, while further examples are capable of various modifications and alternative forms, some example examples thereof are shown by way of example in the figures and will herein be described in detail. It should be understood, however, that there is no intent to limit example examples to the particular forms disclosed, but on the contrary, example examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example examples only and is not intended to be limiting of further example examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
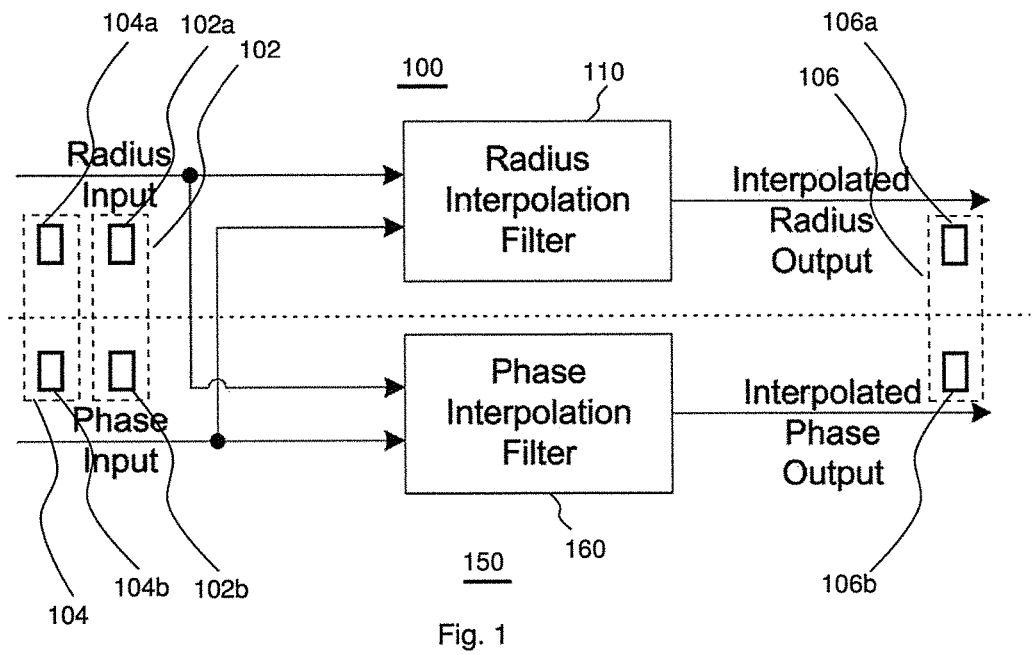
FIG. 1 illustrates two examples of interpolators and methods for determining an interpolated complex-valued sample.

FIG. 1 illustrates, in the upper part, an example of an interpolator 100 and, in the lower part, a further example of an interpolator 150.

The interpolators 100, 150 perform a method for determining an interpolated complex-valued sample. Details of the method and the interpolators 100, 150 are subsequently described together, referencing the schematic view of an apparatus in FIG. 1.

The interpolator 100 comprises a circuit 110 configured to determine a radial component 106a of an interpolated sample 106 using information on a radial component 102a, 104a and information on a phase component 102b, 104a of a first complex-valued sample 102 and of a second complex-valued sample 104.

Each complex-valued sample is represented by a radius value R and by a phase value φ. The circuit 110 uses information on the radial components 102a and 104a as well as information on the phase components 102b and 104b of the first complex-valued sample 102 and of the second complex-valued sample 104 to determine a radial component 106a of an interpolated sample 106, the interpolated sample being interpolated between the first complex-valued sample 102 and the second complex-valued sample 104. By considering also information on the phase component of the first complex-valued sample 102 and of the second complex-valued sample 104, an accuracy of the determination of the radial component 106a of the interpolated sample 106 may be increased and an error in the interpolation may be avoided, as opposed to conventional approaches considering only radial components of the input samples for the interpolation. In principle, the accuracy may be increased infinitely without introducing errors in the interpolated signal.

The further interpolator 150 illustrated in FIG. 1 operates similarly in order to provide a phase component 106b of an interpolated sample 106 with high accuracy. To this end, the interpolator 150 comprises a circuit 160 configured to determine a phase component 106b of the interpolated sample 106 using information on a phase component 102b and 104b and information on a radial component 102a, 104a of the first complex-valued sample 102 and of the second complex-valued sample 104. Similar to the radial component, the generation of a systematic error within the phase component of the interpolated sample may be avoided and the interpolation accuracy may be increased significantly.

While the examples of interpolators 100 and 150 illustrated in FIG. 1 may each be used as an individual interpolator so as to provide one interpolator providing only radial components and another one providing only phase components, some examples may jointly use both interpolators 100 and 150 together in order to provide an interpolated sample 106 using two complex-valued input samples 102 and 104. Further examples may also use one of the interpolators 100 or 150 together with a conventional interpolator considering only one of the radial component or the phase component of the input samples as an input. For example, interpolator 100 may be used together with a conventional interpolator for generation of an interpolated phase component. Likewise, interpolator 150 may be used together with a conventional interpolator providing a conventionally-generated radial component of the interpolated sample.

While the information on the radial component and the information on the phase component used by interpolators and methods for generating a complex-valued sample as described herein may be the radius value of a complex number and the phase value of a complex number, further examples may also use quantities derived from the radial component and from the phase component, which may result in an increase of accuracy or in a further decrease of an error signal. Some examples use the phase derivative as an input to the circuit 160 of the filter 150. This may avoid instabilities resulting from possible tracking problems. The phase value is a cyclic quantity which may result with problems in providing and tracking an absolute value for the phase component for a long series of complex-valued samples. The use of the derivative of the phase component of the series of subsequent complex-valued samples may alleviate this problem since it considers the instantaneous frequency or the momentary change of the phase component which is easily accessible. At the same time, the essential information required for successful interpolation is maintained, which is the change of the phase component between subsequent samples. Some examples use the difference between the phase values of subsequent complex-valued input samples as an input to the circuit 160, which may allow for a computationally-efficient implementation still maintaining all required information.

Further examples may also use other input quantities than derivatives of the radial component and/or the phase component in order to provide interpolated samples with high accuracy. The precise input value or the function used to determine the information on the radial component and on the phase component of the complex-valued samples may be adapted to the particular requirements or to the implementation, which may also consider the computational power available in the particular implementation.

Figure 2:
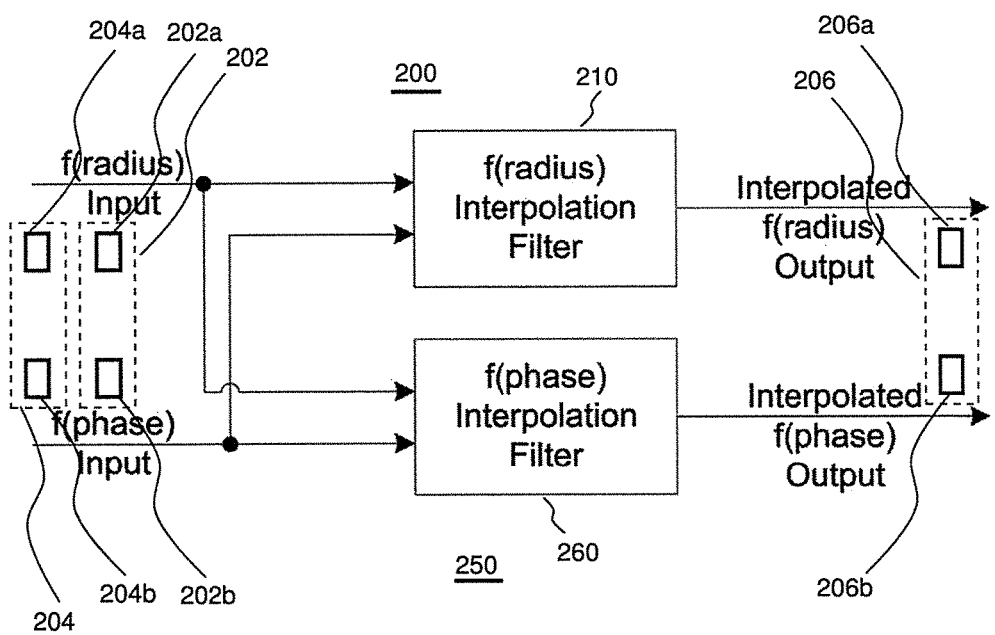
FIG. 2 illustrates two further examples of interpolators.

FIG. 2 illustrates a further example, illustrating the previously-described general approach. Information on a radial component 202a, 204a (f(radius)) is derived from the radius value of the complex-valued samples, for example using an appropriately-chosen function. Likewise, information on a phase component 202b, 204b f(phase) is derived using an appropriately-chosen function for the phase values of the complex-valued input samples. The functions may be arbitrarily chosen so as to fulfill the requirements of the particular implementation. Likewise, the output of the filters or interpolators 200 and 250 may be information on a radial component of the interpolated sample 206a (Interpolated f(radius)) and information on a phase component 206b (Interpolated f(phase)) of the interpolated sample. That is, the output may not be directly the radius value and the phase value of each interpolated sample but a quantity depending on the radius value and the phase value. The terms radial component and information on a radial component may be synonymously used within this application, whenever the output of the interpolator or the filter is concerned. Likewise, the term phase component and information on a phase component may be used synonymous if the output of the interpolator or the filter is concerned.

In other words, the examples are about making the R/φ interpolation as good as I/Q interpolation. In the R/φ domain the radius interpolation filter uses radius data as well as phase data for calculating the radius output (state of the art only radius data). Similarly, the phase interpolation filter uses phase data as well as radius data for calculating the phase output (state of the art only phase data). In principal the radius and phase data could be somehow preprocessed before they are fed into the interpolation filter, which is illustrated in FIG. 2. Therefore we call them f(radius) and f(phase) input data, f(radius) and f(phase) interpolation filter and interpolated f(radius) and f(phase) output. A typical preprocessing operation may be differentiation of the phase, which means that the instantaneous frequency, is calculated. Differentiated phase (instantaneous frequency) data may be fed to the f(radius) and f(phase) interpolation filters 210 and 260.

Figure 3:
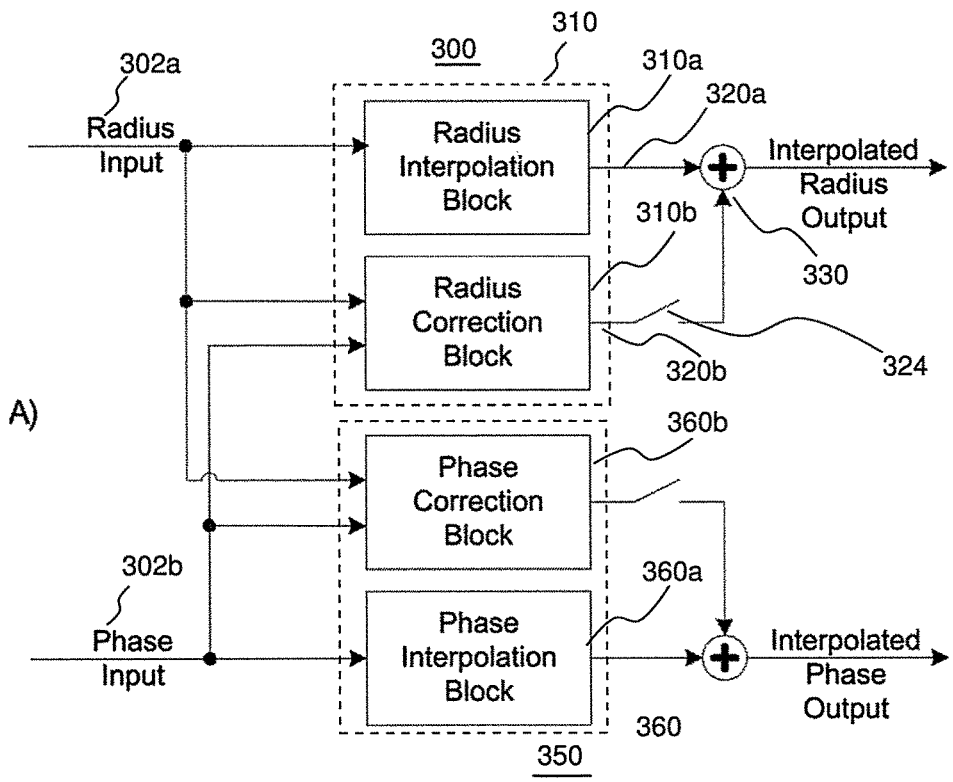
FIG. 3 illustrates a further example of an interpolator.
Figure 4:
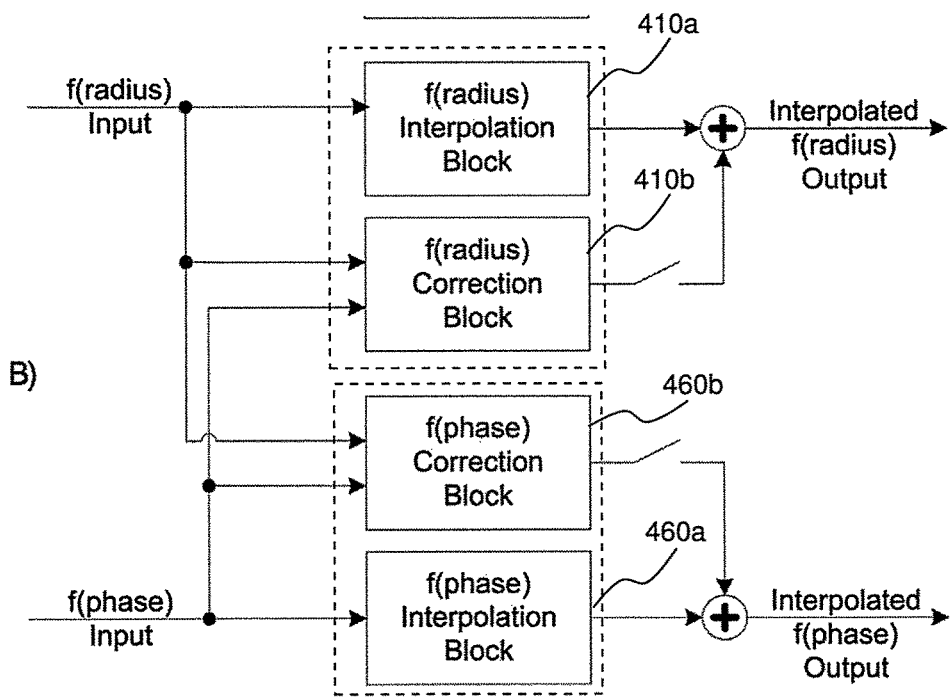
FIG. 4 illustrates yet a further example of an interpolator.

FIGS. 3 and 4 illustrate further examples where the information on the phase component and the information on the radial component are used differently within the interpolators 310 and 350. According to the example illustrated in FIG. 3, the circuit 310 comprises a first sub-circuit 310a and a second sub-circuit 310b. Likewise, the circuit 360 comprises a first sub-circuit 360a and a second sub-circuit 360b. The first sub-circuit 310a receives only information on a radial component 302a of the complex-valued samples as an input, while the second sub-circuit 310b receives information on the radial component 302a as well as information on a phase component 302b of the complex-valued samples as an input. The first sub-circuit 310a determines a first portion 320a of the radial component and the second sub-circuit 310b determines a second portion of the radial component 320b using the information on the radial component and the information on the phase component. A combiner 330 serves to combine the first portion of the radial component 320a and the second portion of the radial component 320b to provide the radial component of the interpolated complex-valued sample. The first portion of the radial component 320a may be provided using a conventional approach based on information on the radial component 302a of the input samples only, while a correction value may be applied as the second portion of the radial component 320b in order to correct for an error of the conventional approach. This may provide for the possibility to use existing implementations for the first sub-circuit 310a which may be easily enhanced by introducing a further sub-circuit 310b. Only the second sub-circuit 310b is required to also receive information on the phase component 302b of the input complex-valued samples.

According to further examples, the operation of the second sub-circuit 310b may be switched on and off on demand by means of a switch 324. This may allow to use a high interpolation accuracy using also the second sub-circuit 310b when a high accuracy of the interpolation is required for the determination of the interpolated samples. On the other hand, when a high accuracy is not required, the power consumption of the second sub-circuit 320b may be saved so as to extend operation and standby times of, for example, mobile telecommunication devices using interpolators as described herein.

In other words, it may be possible to orthogonalize the radius and phase data in a way, that the 'radius interpolation block' operates like state of the art only on radius data input and the 'radius correction block' calculated the correction data based on phase and radius data input.

In a similar manner, the filter or circuit 360 for generating the phase component of an interpolated sample comprises a first sub-circuit 360a and a second sub-circuit 360b. The first sub-circuit 360a receives only information on a phase component of the input samples while the second sub-circuit 360b additionally receives information on the radial component of the input samples. A first portion of the phase component of the interpolated sample is determined by the first sub-circuit 360a while a second portion of the phase component is determined by the second sub-circuit 360b. Similar to the interpolator 300, the second sub-circuit 360b of interpolator 350 may be switched on and off according to the requirements, enabling low power consumption modes and increasing the overall efficiency of a device comprising interpolators as an output.

FIG. 4 illustrates examples of interpolators which are based on the examples described in FIG. 3. Similar to FIG. 2, the examples illustrated in FIG. 4 illustrate a more general approach in that it is not necessarily the radial component and the phase component directly which is to be input into first and second sub-circuits 410a, 410b, 460a and 460b.

Similar to the example of FIG. 2, quantities which depend in an arbitrary manner on the radius values and the phase values of the input samples may be used instead. Since the further functionality of the interpolators illustrated in FIG. 4 is identical to the one illustrated in FIG. 3, further description of the example of FIG. 4 is omitted and reference is herewith made to the corresponding paragraphs relating to FIG. 3.

In other words, with the cross coupling structure of FIGS. 3 and 4 it may be easy to build up a 'performance on demand' system. For high bandwidth and high output power the cross coupling is switched on. For lower bandwidth or/and lower output power the cross coupling circuit can be switched off. The performance may the be worse which is acceptable when it is not required and the power consumption goes down.

While the examples illustrated in FIGS. 3 and 4 may enable to save energy when possible by disabling some of the sub-circuits within the interpolators, further examples may provide for the possibility to vary the accuracy of the determination of the interpolated radial components and/or the interpolated phase components in order to save energy. When high accuracy is required, the accuracy for the determination of the radial and phase components may be increased, while the accuracy is decreased when it is not needed. Providing a higher interpolation accuracy requires a higher computational complexity, which in turn, may result with a higher energy consumption. An overall energy-saving may be achieved when the accuracy is decreased. Some examples use Taylor series to determine an interpolated complex-valued sample. If the accuracy requirements are low, the order of the Taylor series evaluated during the interpolation may be decreased, resulting in savings of the computational complexity and, consequently, in power consumption.

That is, decreasing the order of the Taylor polynomial evaluated in the interpolation may lead to an overall error consumption of a mobile telecommunications device using an example of an interpolator or employing an example of a method for determining an interpolated complex-valued sample within its transmit signal processing chain.

One particular example as to how interpolated complex valued samples may be derived using a taylor approximation is given by means of the following pseudo code:

$CrossCoupled[\text{x\_List}, \text{w\_List}] :=$ $\text{Module}[\{r0, r4, r1, r3, p0, p4, p1, p3, z1, z3, \Delta p, rd1, rd3, img1, img3\},$ (∗ Winkelinput in Rad, w~Genauigkeit der Taylorreihe ∗)

$\{\{r0, p0\}, \{r4, p4\}\} = x; \Delta p = \text{Mod}[p4 - p0 + Pi, 2Pi] - Pi;$ $$z1 = w \cdot \left\{ \frac{3r0}{4} + \frac{r4}{4}, \left( \frac{3ir0}{16} - \frac{3ir4}{16} \right) \Delta p, \right.$$

$$\left. \left( -\frac{3r0}{128} - \frac{9r4}{128} \right) \Delta p^2, \left( -\frac{ir0}{512} + \frac{9ir4}{512} \right) \Delta p^3 \right\};$$

(∗ original plus cross coupled terms ∗) $z3 = w \cdot \left\{ \frac{r0}{4} + \frac{3r4}{4}, \right.$ $$\left( \frac{3ir0}{16} - \frac{3ir4}{16} \right) \Delta p, \left( -\frac{9r0}{128} - \frac{3r4}{128} \right) \Delta p^2, \left( -\frac{9ir0}{512} + \frac{ir4}{512} \right) \Delta p^3 \right\};$$

(∗ original plus cross coupled terms ∗)

$rd1 = \text{Re}[z1]; rd3 = \text{Re}[z3]; img1 = \text{Im}[z1];$ $img3 = \text{Im}[z3]; rd1 = \text{Sqrt}[rd1^2 + img1^2];$ -continued (* exact Radius, can be skipped with minor error *)

$$rd3 = Sqrt[rd3^{\wedge}2 + img3^{\wedge}2];$$

(* exact Radius, can be skipped with minor error *)

$$p1 = Mod[p0 + \Delta p/4 - img1/rd1 + Pi, 2Pi] - Pi;$$

$$p3 = Mod[p4 + \Delta p/4 - img3/rd3 + Pi, 2Pi] - Pi;$$

$$\{\{rd1, p1\}, \{rd3, p3\}\}]$$

The above code illustrates one particular example for providing radial components r1 and r3 for two interpolated samples z1 and z3 between two neighboring complex valued samples r0, p0 and r4, p4. The radial components r1 and r3 of the two interpolated samples z1, z3 are determined using information on a radial component r1, r4 and information on of a phase component p1, p4 of the first complex valued sample (r0, p0) and of the subsequent second complex valued sample (r4, p4).

First, phase difference $\Delta p$ between the first complex valued sample and the second complex valued sample is determined. Using the phase difference $\Delta p$, an approximation for the interpolated samples z1, z3 is determined using a taylor series approximation. In the given example, a taylor series up to the third order may be evaluated. A vector w having 4 components may additionally be used to vary the order of the taylor series to be evaluated to possibly save energy in the event of lower required accuracies. A real part rd1 and an imaginary part img1 of the approximation for the interpolated sample z1 is determined. The exact radius may be determined using real part rd1 and an imaginary part img1. Further, an approximation for the phase component p1 of the interpolated sample z1 is determined using $\Delta p$, the real part rd1 and the imaginary part img1. The phase component p3 of the interpolated sample z3 is determined likewise. The same operations are performed for determining real part rd3 and phase component p3 of the interpolated sample z3. The previous example uses vector w to optionally decrease the computational complexity to save energy by setting some components of w to zero in order to skip the evaluation of the corresponding term of the series. Other ways to achieve the same result are, of course, also within the scope of this disclosure.

A further example as to how interpolated complex valued samples may be derived using a taylor approximation is given by means of the following pseudo code. The following example allows to deviate from the fixed times for the two interpolated samples of the preceding implementation. In particular, the sample time can be chosen arbitrarily between the sample times of the complex valued samples (r0, p0) and (r4, p4). Further, the order of the Interpolation can be chosen by means of the integer parameter "w":

$FracTwo(r\_List, p\_List, t\_, w\_Integer) :=$ $$Module[\{r0, r4, r1, p0, p4, p1, z1, \Delta p, rd1, img1\},$$

$$\{r0, r4\} = r; \{p0, p4\} = p; \Delta p = (-p0 + p4 + \pi) \bmod(2\pi) - \pi;$$

$$z1 = \sum_{n=0}^{w} \frac{i^n(t-1)t\Delta p^n(r4(t-1)^{n-1} - r0t^{n-1})}{n!}; rd1 = \text{Re}(z1);$$

$$img1 = \text{Im}(z1); p1 = \left(p0 + t\Delta p - \tan^{-1}\left(\frac{img1}{rd1}\right) + \pi\right) \bmod(2\pi) - \pi;$$

$$rd1 = \sqrt{img1^2 + rd1^2}; \{rd1, p1\}]$$

A further example as to how interpolated complex valued samples may be derived is given by means of the following pseudo code. The following example uses three consecutive samples (r0, p0), (r4, p4) and (r8, p8) to generate an interpolated sample and its radial and phase components rd3 and p3. Again, the order of the Interpolation can be chosen by means of the integer parameter "w". The following example is based on Spline Interpolation using three neighboring input samples. Further examples may, of course, also use more input samples, for example 4, 5, 6 or any higher number if desirable.

$FracThreeSpline(r\_List, p\_List, t\_, w\_Integer) :=$ $$Module[\{r0, r4, r8, r1, p0, p4, p8, p3, z3, \Delta p1, \Delta p2, k1, rd3, img3\},$$

$$\{r0, r4, r8\} = r; \{p0, p4, p8\} = p; \Delta p1 = (-p0 + p4 + \pi) \bmod(2\pi) - \pi;$$

$$\Delta p2 = (-p4 + p8 + \pi) \bmod(2\pi) - \pi;$$

$$z3 = r4\left(\frac{3}{4} - t^2\right) + \sum_{n=0}^{w} \frac{(-i)^n(r0(1-2t)^2\Delta p1^n + r8(2t+1)^2(-\Delta p2)^n)}{8n!};$$

$$rd3 = \text{Re}(z3); img3 = \text{Im}(z3);$$

$$p3 = \left(p4 + \tan^{-1}\left(\frac{img3}{rd3}\right) + \pi\right) \bmod(2\pi) - \pi;$$

$$rd3 = \sqrt{img3^2 + rd3^2}; \{rd3, p3\}]$$

The following further example as to how interpolated complex valued samples may be derived is based on the principle of the Lagrange interpolation and given by means of the following pseudo code. The following example uses three consecutive samples (r0, p0), (r4, p4) and (r8, p8) to generate an interpolated sample and its radial and phase components rd3 and p3. Again, the order of the Interpolation can be chosen by means of the integer parameter "w" and further examples may, of course, also use more input samples, for example 4, 5, 6 or any bigger number if desirable.

$FracThreeLagrange(r\_List, p\_List, t\_, w\_Integer) :=$ $$Module[\{r0, r4, r8, r1, p0, p4, p8, p3, z3, \Delta p1, \Delta p2, k1, rd3, img3\},$$

$$\{r0, r4, r8\} = r; \{p0, p4, p8\} = p; \Delta p1 = (-p0 + p4 + \pi) \bmod(2\pi) - \pi;$$

$$\Delta p2 = (-p4 + p8 + \pi) \bmod(2\pi) - \pi;$$

$$z3 = r4(1 - t^2) + \sum_{n=0}^{w} \frac{(-i)^n t(r0(t-1)\Delta p1^n + r8(t+1)(-\Delta p2)^n)}{2n!};$$

$$rd3 = \text{Re}(z3); img3 = \text{Im}(z3);$$

$$p3 = \left(p4 + \tan^{-1}\left(\frac{img3}{rd3}\right) + \pi\right) \bmod(2\pi) - \pi;$$

$$rd3 = \sqrt{img3^2 + rd3^2}; \{rd3, p3\}]$$

Figure 5:
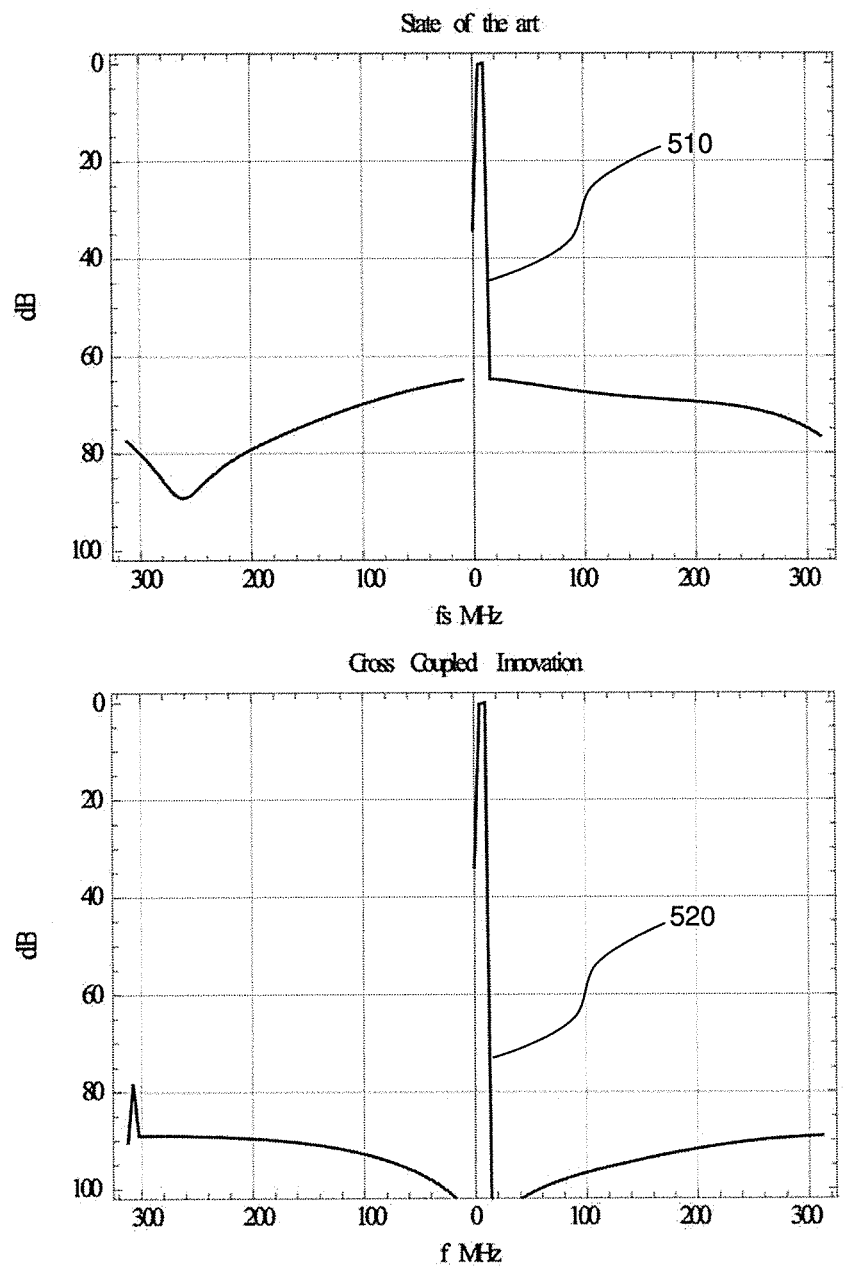
FIG. 5 illustrates a signal provided by an example as described herein as compared to a signal according to a conventional approach.

FIG. 5 illustrates two illustrations of signals generated using interpolators as described, for example, with respect to FIGS. 1 to 4 as compared to a conventional approach. The upper illustration shows a signal as generated by the conventional approach while the lower illustration illustrates the signal as achievable with interpolators as described herein.

In any of the preceding examples, $$\tan^{-1}\left(\frac{imgx}{rdx}\right)$$

may be approximated by means of $$\frac{imgx}{rdx}.$$

Likewise, $\sqrt{(rdx)^2+(imgx)^2}$ may be approximated by rd x to save computational power and to become more energy efficient, in particular when img (x) is smaller than rd (x).

Further, other interpolation rules may be applied in further embodiments in order to determine an interpolated complex valued number. Also further interpolation rules may use two, three or even more complex valued samples for the interpolation.

The x-axis of the illustration shows the distance to the sampling frequency in MHz and the y-axis illustrates the power density of the signal. As it becomes apparent from the first graph 510 relating to the conventional approach, the power density close to the sampling frequency remains at a comparatively high level of roughly −70 dB, which is due to the noise generated by the error performed when using interpolation filters or interpolators according to the conventional approach.

As it becomes apparent from the graph 520 of the lower illustration, the noise floor close to the sampling frequency can be decreased significantly, down to roughly −90 dB, if interpolators or methods for interpolating according to the examples described herein are used to generate the signal. Mobile telecommunication devices, for example those being compliant to the long-term evolution (LTE) standard may so achieve compliance with the spectral requirements (spectral masks) defined by the LTE standard. The signal characteristics may even exceed the requirements significantly, which does not only contribute to a lower disturbance of further telecommunication devices within the LTE network, but also avoids disturbance of further devices of, for example, a mobile user equipment itself. For example, spurious or noise components transmitted by means of the mobiles' antennas may couple to receive antennas for other services which may also be present at a user equipment, such as for example, Bluetooth and GPS antennas or the like.

Figure 6:
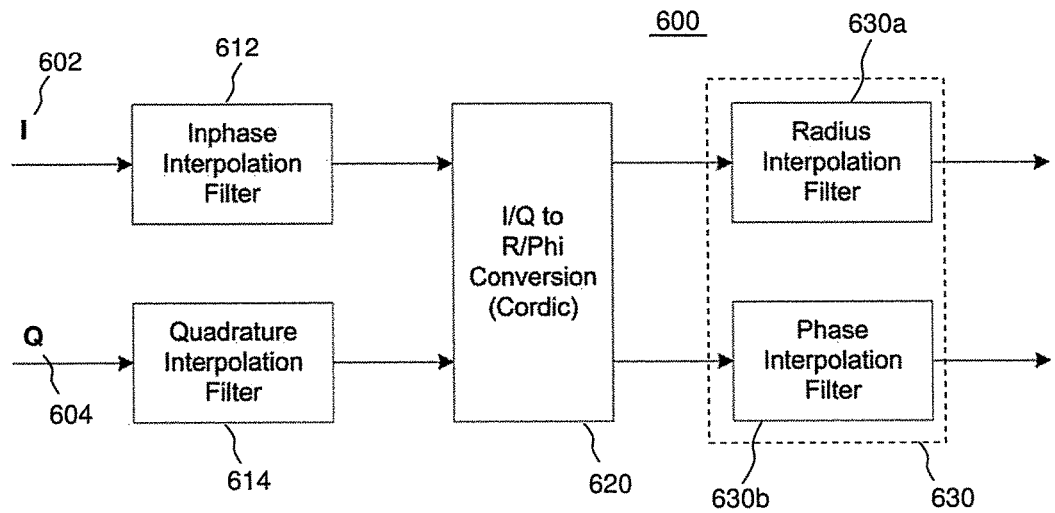
FIG. 6 illustrates an example of a transmitter for a mobile communication device.

FIG. 6 schematically illustrates an example of a transmitter 600 as it may be used within, for example, such a mobile telecommunications device. The transmitter 600 illustrated in FIG. 6 is based on and compliant with conventional transmitters and baseband signal logic. To this end, it may receive inphase (I) and quadrature components (Q) 602, 604 from the baseband signal processing logic as an input. The I- and the corresponding Q-component constitute a complex-valued sample, corresponding to, for example, the position of a symbol of the presently used modulation scheme within the constellation diagram.

According to the transmitter 600 illustrated in FIG. 6, a first interpolator 612 is configured to determine a series of interpolated I-samples based on the in-phase components 602 of a series of complex-valued symbols. Likewise, a second interpolator 614 is configured to determine a series of interpolated Q-samples based on the quadrature component 604 of the series of complex-valued symbols. That is, the I- and Q-components may be interpolated according to conventional approaches using already existing signal processing, hardware, logic or the like. A transformer 620 is configured to determine a series of radius components or samples and a series of phase components or samples based on the series of interpolated I-samples and on the series of interpolated Q-samples. An interpolator 630a according to the examples described herein is coupled to the transformer 620 so as to receive the series of radius components and the series of phase components as an input and to provide a series of interpolated radius components as an output. Likewise, a further interpolator 630b is coupled to the transformer 620 to provide a series of interpolated phase components using the series of radius components and the series of phase components as an input.

To this end, existing hardware configurations, baseband logic or the like may be enhanced and modified in order to enable direct generation or synthesizing of a baseband signal using R/φ-modulators, at the same time maintaining the signal quality generated by the transmitter as high as possible. The introduction of additional noise or spurious in the spectrum may be completely avoided or suppressed.

In other words, FIG. 6 illustrates the application of an example of an interpolator or filter in the digital chain of a Polar Transmitter. The application of an example of an interpolator may help to reduce power consumption and to extend the concept of Polar Transmitters to systems with higher bandwidth like 160 MHz WLAN or 60 GHz TX. For example in LTE 20, a digital transmitter receives input samples from baseband at a low rate (e.g. 30.72 MHz for LTE20) and delivers output samples at DAC rate (1 . . . 2 GHZ). The output power spectrum of the transmitter is defined by standardization, e.g. 3G and LTE communication systems are defined by the 3GPP group. The desired attenuation and interpolation ratio of the whole digital filter chain is predetermined. In a first step of the example of a transmitter illustrated in FIG. 6 the signal is interpolated in I/Q domain, in a second step the signal is converted from I/Q domain to R/φ domain (e.g. using a cordic) and in third step the signal is interpolated in R/φ domain.

Figure 7:
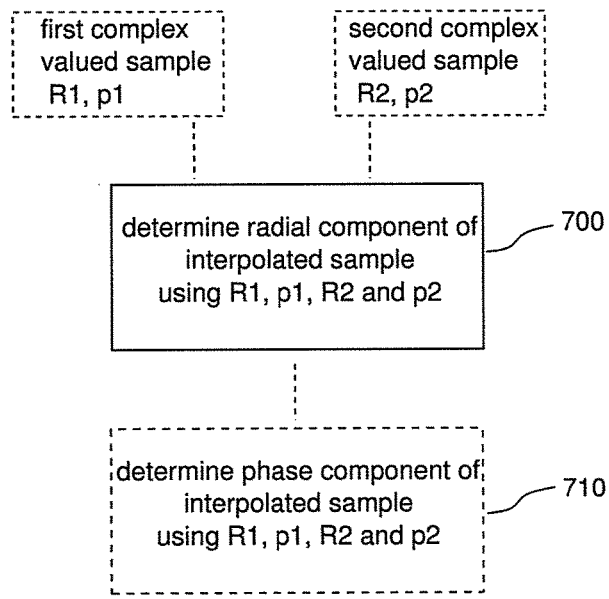
FIG. 7 illustrates a flowchart of an example of a method for determining an interpolated complex-valued sample.

FIG. 7 schematically illustrates a flowchart for a method for determining an interpolated complex valued sample. The method comprises determining a radial component (700) of the interpolated sample using information on a radial component and information on of a phase component of a first complex valued sample and of a second complex valued sample.

FIG. 7 furthermore illustrates optional determining of a phase component (710) of the interpolated sample using information on the phase component and information on the radial component of the first complex valued sample and of the second complex valued sample.

Figure 8:
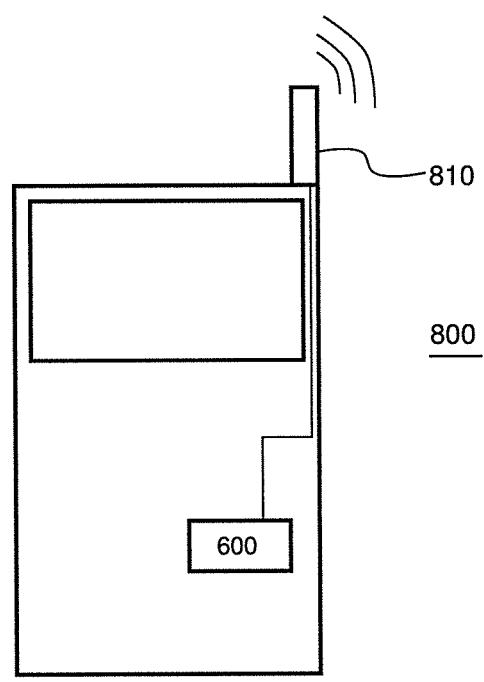
FIG. 8 illustrates a mobile user equipment comprising an example of an interpolator.

FIG. 8 schematically illustrates an example of a mobile telecommunications device or user equipment or mobile phone 800 of a mobile telecommunications network. The mobile phone 800 comprises a transmitter 600 using one or multiple examples of interpolators within its transmit path. The transmitter 600 is coupled to an antenna 810 used to send and receive the wireless communication signal of the mobile telecommunications device 800. Mobile telecommunication devices or mobile phones 800 using examples of interpolators or filters as described herein may have a significantly cleaner spectrum than devices using conventional interpolators.

Example 1 is a method for determining an interpolated complex valued sample, comprising determining a radial component of the interpolated sample using information on a radial component and information on a phase component of a first complex valued sample and of a second complex valued sample.

In example 2, the method of example 1 further optionally comprises determining a phase component of the interpolated sample using information on the phase component and information on the radial component of the first complex valued sample and of the second complex valued sample.

In example 3, the information on the phase component of examples 1 or 2 corresponds to a phase difference between the first complex valued sample and the second complex valued sample.

In example 4, the determining of the interpolated sample of any of the preceding examples comprises determining at least one interpolated complex valued number.

In example 5, an accuracy of the determination of the interpolated complex valued number of any of the preceding examples is variable.

In example 6, the determining of the at least one interpolated complex valued number of example 4 or 5 comprises an evaluation of a taylor series.

In example 7, an order of the taylor series of the method of example 6 is variable.

In example 8, wherein the determination of the interpolated complex valued number of example 4 optionally further uses information on a radial component and information on a phase component of a third complex valued sample.

In example 9, determining of the at least one interpolated complex valued number of example 8 comprises an evaluation of a Spline interpolation or of a lagrange interpolation using the first, second and third complex valued samples.

In example 10, determining the radial component of the interpolated sample of any of examples 1 to 9 comprises determining a first portion of the radial component of the interpolated sample using the information on the radial component of the first complex valued sample and of the second complex valued sample; determining a second portion of the radial component of the interpolated sample using the information on the radial component and the information on the phase component of the first complex valued sample and of the second complex valued sample; and combining the first portion of the radial component and the second portion of the radial component.

Example 11 is a method for determining an interpolated complex valued sample, comprising determining a phase component of the interpolated sample using information on a phase component and information on a radial component of a first complex valued sample and of a second complex valued sample.

In example 12, the method of example 11 optionally further comprises determining a radial component of the interpolated sample using information on the radial component and information on the phase component of the first complex valued sample and of the second complex valued sample.

In example 13, the information on the phase component of example 11 or 12 corresponds to a phase difference between the first complex valued sample and the second complex valued sample.

In example 14, determining of the interpolated sample of any of examples 11 to 13 comprises determining at least one interpolated complex valued number.

In example 15, an accuracy of the determination of the interpolated complex valued of example 14 is variable.

Example 16 is a method for determining an interpolated complex valued sample, comprising: in a first operation mode, determining a radial component of the interpolated sample using information on a radial component and information on of a phase component of a first complex valued sample and of a second complex valued sample, and determining a phase component of the interpolated sample using information on the phase component and information on the radial component of the first complex valued sample and of the second complex valued sample; and in a second operation mode, determining a radial component of the interpolated sample using only information on the radial component of the first complex valued sample and of the second complex valued sample, and determining a phase component of the interpolated sample using only information on the phase component of the first complex valued sample and of the second complex valued sample.

Example 17 is an Interpolator, comprising a circuit configured to determine a radial component of an interpolated sample using information on a radial component and information on of a phase component of a first complex valued sample and of a second complex valued sample.

In example 18, the Interpolator of example 17 optionally further comprises a further circuit configured to determine a phase component of the interpolated sample using information on the phase component and information on the radial component of the first complex valued sample and of the second complex valued sample.

Example 19 is an Interpolator, comprising: a circuit configured to determine a phase component of the interpolated sample using information on a phase component and information on a radial component of a first complex valued sample and of a second complex valued sample.

In example 20, the Interpolator of example 19 optionally further comprises a further circuit configured to determine a radial component of the interpolated sample using information on the radial component and information on the phase component of the first complex valued sample and of the second complex valued sample.

Example 21 is a transmitter for a mobile communication device, comprising a first interpolator configured to determine a series of interpolated I-samples based on an in-phase component of a series of complex valued symbols; a second interpolator configured to determine a series of interpolated Q-samples based on a quadrature component of a series of complex valued symbols; a transformer configured to determine a series of radius samples and a series of phase samples based on the series of interpolated I-samples and on the series of interpolated Q-samples; and an interpolator according to any of examples 17 or 18 coupled to the transformer.

In example 22, the transmitter of example 21 optionally further comprises an interpolator according to any of examples 19 or 20 coupled to the transformer.

Example 23 is means for determining an interpolated complex valued sample, comprising means for determining a radial component of the interpolated sample using information on a radial component and information on of a phase component of a first complex valued sample and of a second complex valued sample.

Example 24 is means for determining an interpolated complex valued sample, comprising means for determining a phase component of the interpolated sample using information on a phase component and information on a of radial component of a first complex valued sample and of a second complex valued sample.

Example 25 is a computer program having a program code for performing the method of any of examples 1 to 16, when the computer program is executed on a computer or processor.

Example 26 is a computer readable storage medium having stored thereon a program having a program code for performing the method of any of examples 1 to 16, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some example examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A method for determining an interpolated complex sample, comprising:
   receiving at a radial interpolation circuit a first complex sample comprising a first radial sample component and a first phase sample component;
   receiving at the radial interpolation circuit a second complex sample comprising a second radial sample component and a second phase sample component; and
   determining, using the radial interpolation circuit, an interpolated radial sample component of the interpolated complex sample using the first radial sample component and the first phase sample component of the first complex sample, and using the second radial sample component and the second phase sample component of the second complex sample.

2. The method of claim 1, further comprising:
   determining, using a phase interpolation circuit, an interpolated phase component of the interpolated complex sample using the first radial sample component and the first phase sample component of the first complex sample, and using the second radial sample component and the second phase sample component of the second complex sample.

3. The method of claim 1, wherein using the first and second phase sample components comprises calculating a phase difference between the first complex sample and the second complex sample.

4. The method of claim 1, wherein determining of the interpolated complex sample comprises determining at least one interpolated complex number.

5. The method of claim 4, wherein an accuracy of the determination of the interpolated complex number is variable.

6. The method of claim 4, wherein the determining of the at least one interpolated complex number comprises an evaluation of a Taylor series.

7. The method of claim 6, wherein an order of the Taylor series is variable.

8. The method of claim 4, wherein the determination of the interpolated complex number further uses a third radial sample component and a third phase sample component of a third complex sample.

9. The method of claim 8, wherein determining of the at least one interpolated complex number comprises an evaluation of a Spline interpolation or of a Lagrange interpolation using the first, second and third complex samples.

10. The method of claim 1, wherein determining the radial sample component of the interpolated complex sample comprises:
    determining a first portion of the interpolated radial sample component of the interpolated complex sample using the first and second radial components of the first complex sample and of the second complex sample, respectively;
    determining a second portion of the interpolated radial sample component of the interpolated complex sample using the first and second radial sample components and the first and second phase sample components of the first complex sample and of the second complex sample; and
    combining the first portion of the interpolated radial sample component and the second portion of the interpolated radial sample component.

11. A method for determining an interpolated complex sample, comprising:
    in a first operation mode,
        determining, using a radial interpolation circuit, an interpolated radial sample component of the interpolated complex sample using a radial component and a phase component of a first complex sample and of a second complex sample, and
        determining, using a phase interpolation circuit, an interpolated phase sample component of the interpolated complex sample using the phase component and the radial component of the first complex sample and of the second complex sample; and
    in a second operation mode,
        determining, using the radial interpolation circuit, the interpolated radial sample component of the interpolated complex sample using only the radial component of the first complex sample and of the second complex sample, and
        determining, using the phase interpolation, the interpolated phase sample component of the interpolated complex sample using only the phase component of the first complex sample and of the second complex sample.

12. An interpolator, comprising:
    a phase interpolation circuit configured to receive first and second complex samples comprising first and second radial sample components and first and second phase sample components, respectively;
    wherein the phase interpolation circuit is further configured to determine an interpolated phase component of an interpolated complex sample using the first and second phase sample components and the first and second radial sample components.

13. The Interpolator of claim 12, further comprising a radial interpolation circuit configured to determine an interpolated radial component of the interpolated complex sample using the first and second radial sample components and the first and second phase sample components.

14. A computer program having a program code stored on a non-transitory storage medium for performing a method when the computer program is executed on a computer or processor, the method comprising:
    receiving at a radial interpolation circuit a first complex sample comprising a first radial sample component and a first phase sample component;
    receiving at the radial interpolation circuit a second complex sample comprising a second radial sample component and a second phase sample component; and
    determining, using the radial interpolation circuit, an interpolated radial sample component of the interpolated complex sample using the first radial sample component and the first phase sample component of the first complex sample, and using the second radial sample component and the second phase sample component of the second complex sample.

* * * * *